(12) United States Patent
Akaike et al.

(10) Patent No.: US 6,712,262 B2
(45) Date of Patent: Mar. 30, 2004

(54) WATER-SOLUBLE PREFLUX, PRINTED CIRCUIT BOARD, AND PROCESS FOR TREATING THE SURFACE OF A METAL IN A PRINTED CIRCUIT BOARD

(75) Inventors: Shinichi Akaike, Saitama (JP); Kazutaka Nakanami, Saitama (JP); Yoshiyuki Takahashi, Saitama (JP); Takao Ono, Saitama (JP)

(73) Assignee: Tamurakaken Corporation, Saitama (JP)

( * ) Notice: Subject to any disclaimer, the term of this patent is extended or adjusted under 35 U.S.C. 154(b) by 0 days.

(21) Appl. No.: 10/197,764

(22) Filed: Jul. 18, 2002

(65) Prior Publication Data

US 2003/0141351 A1 Jul. 31, 2003

(30) Foreign Application Priority Data

Jul. 19, 2001 (JP) .......................................... 2001-218911

(51) Int. Cl.[7] ................................................. B23K 1/20
(52) U.S. Cl. ............................ 228/207; 148/23; 148/24; 148/25; 148/26; 228/206; 228/205; 228/223
(58) Field of Search ................................. 228/207, 206, 228/205, 223; 148/23, 24, 25, 26

(56) References Cited

U.S. PATENT DOCUMENTS

| 5,441,814 | A | * | 8/1995 | Gunji et al. | ................. | 428/457 |
| 5,476,947 | A | * | 12/1995 | Maki et al. | ............... | 548/304.4 |
| 5,478,607 | A | * | 12/1995 | Gunji et al. | ................. | 427/557 |
| 6,339,197 | B1 | * | 1/2002 | Fushie et al. | ............... | 174/262 |

FOREIGN PATENT DOCUMENTS

| JP | 05-025407 | 2/1993 |
| JP | 05-186888 | 7/1993 |

* cited by examiner

Primary Examiner—M. Alexandra Elve
Assistant Examiner—Christina Ildebrando
(74) Attorney, Agent, or Firm—King & Schickli, PLLC

(57) ABSTRACT

The invention provides a water-soluble preflux that can solve problems with a soldering land array having a narrow spacing in that fused solder is likely to cause soldering bridges with defective soldering, a printed circuit board with its film formed thereon, and a surface treatment process for a metal in that circuit. The water-soluble preflux comprises given two different benzimidazoles compound and an iodine-based compound optionally with an amino acid, etc. The invention provides a printed circuit board with a film of that preflux formed thereon, and a surface treatment process for the metal in that circuit.

14 Claims, No Drawings

WATER-SOLUBLE PREFLUX, PRINTED CIRCUIT BOARD, AND PROCESS FOR TREATING THE SURFACE OF A METAL IN A PRINTED CIRCUIT BOARD

TECHNICAL FIELD

The present invention relates to a water-soluble preflux containing a water-soluble salt of a benzimidazole-based compound, which can improve the wetting coverage of fused solder during soldering in particular, a printed circuit board having a film of such a preflux formed thereon, and a process for the surface treatment of metals in printed circuit boards.

BACKGROUND OF THE INVENTION

A printed circuit board, comprising a copper-clad laminate board as an example and a printed circuit pattern formed thereon, is designed to form one single circuit unit by mounting electronic parts thereon.

For such a printed circuit board, there is often used a surface mount type that comprises a circuit pattern with circuit interconnections formed on the surface of a board and electronic parts mounted on the circuit pattern. For instance, when a chip part having electrodes at both ends is used as an electronic part, a flux is first coated on the printed circuit board, and the chip part is then soldered to the printed circuit board by means of a wave soldering process or a reflow soldering process.

For soldering of such chip parts, there is generally used a soldering process wherein after a circuit pattern is formed on a printed circuit board, i.e., a copper foil portion of a copper-clad laminate board is etched in such a way that the desired circuit interconnections are obtained, a solder resist film is coated on the obtained circuit except a portion thereof to which a chip part is soldered, i.e., so-called soldering lands, and micro etching is further carried out, immediately after which soldering is performed. In some cases, however, the steps including coating by a solder resist film and the subsequent soldering step are independently carried out, so that the soldering step can be performed after the solder resist film-coated printed circuit board is stored as a part or by other soldering experts in the process of circulation. In such a case, much time has lapsed until the soldering step is actually carried out. In this period, the exposed copper foil surface of the soldering lands is susceptible to oxidation by air, and this oxidation is more likely to occur in damp environments. To prevent oxidation of that surface, an oxidation-preventive film is formed thereon and a surface protective agent is used to this end.

Even when a printed circuit board coated with a solder resist film is used just after its fabrication, an oxidation-preventive film should be formed. This is because when a reflow soldering process, for instance, is used to mount electronic parts on both surfaces of a printed circuit board, solder powders are fused by heating at high temperatures such as 260° C. after a solder paste is coated on the soldering lands and, consequently, when one surface is soldered, other surface is exposed to high temperatures at which the copper foil surface of the soldering lands is susceptible to oxidation. In such a case, too, an oxidation-preventive film should be formed.

Either when such surface-preventive agent treatment is carried out or when the other surfaces of the soldering lands are subjected to oxidation-preventive treatment so as to prevent deterioration upon heating which may otherwise be caused in association with the soldering of one surface of the printed circuit board, so-called prefluxes are used, among which organic solvent-free, water-soluble ones are preferably used because of no risk of pollutions or fires.

So far, the exposed copper foil of soldering lands has been subjected to rust-preventive treatment. As set forth typically in Japanese patent unexamined publication No. 05-25407 and No. 05-186888, it has been known that water-soluble surface-preventive agents for printed circuit boards containing a benzimidazole-based compound are used as water-soluble prefluxes. According to these publications, a printed board with a copper foil circuit pattern formed on its surface is immersed in the water-soluble surface-protective agent for printed circuit boards to, form a heat-resistant film on the surface of copper and a copper alloy of the circuit pattern on the printed circuit board. This film has also extremely satisfactory humidity resistance even upon exposed to high humidity; it is considerably improved in terms of protection of printed circuit boards and solderability at the time of part mounting. Thus, these surface-protective agents are found to be more improved in terms of productivity, performance, etc., as compared with prefluxes containing rosin or the like, which cause coating films to be formed on portions other than copper foil portions, and make it impossible to give high reliability to circuits without rinsing or pickling boards after parts are mounted thereon.

The compound used to improve this surface-preventive agent preflux, i.e., the benzimidazole-based compound that is the primary component of the surface-preventive agent for printed circuit boards is generally insoluble in water, and so is made soluble by using inorganic acids such as hydrochloric acid and phosphoric acid or organic acids such as acetic acid, oxalic acid and p-toluene-sulfonic acid as solubilizers for forming its water-soluble salt. The acids used as such solubilizers erode a particularly sensitive-to-acid lead film to render its thickness small or oxidizes its surface, often rendering it impossible to obtain the given soldering strength for lead wires at the time of part mounting and poor soldering as well, which may otherwise give rise to some considerable mounting yield drops. Allegedly, this problem may be solved by using an amino acid as the solubilizer thereby making benzimidazole-based compounds soluble in water without recourse to the aforesaid acids, as set forth in Japanese patent unexamined publication No. 05-186888.

Even when water-soluble prefluxes composed primarily of these benzimidazole-based compounds are used, however, much is still left to be desired in terms of the wetting coverage of fused solder when a solder paste is coated on soldering lands and heated to fuse solder powders.

As recent electronic parts slim down with enhanced performance, printed circuit boards in particular are now required to have performance keeping pace with high-density packaging for mounting electronic parts at high density. With this, it is demanded to enable electronic parts to be well soldered to a soldering land array having a much narrower spacing of the order of 0.3 to 0.4 mm. As a solder paste is coated and heated on a soldering land array having a narrow spacing, however, some portions of fused solder formed by fusion of solder powders come into contact with each other on the respective soldering lands. These portions, if they are cooled down as such, often form together a soldering bridge that offers a short-circuit problem, ending up with poorly soldered, defective board products. For those who are required to achieve fierce production cost reductions, it is thus of vital importance to cut back on the incidence of soldering bridges that may occur upon fusion of the aforesaid solder paste film, thereby achieving productivity improvements.

From this point-of-view, there is thus available a process wherein a smaller amount of solder paste than usual is coated on a portion of a soldering land except both its end portions rather than all over the soldering land in such a controlled way that when solder powders are fused and concentrated centrally on that portion into a liquid droplet, the size of the liquid droplet is kept from becoming excessively large, whereby fused solder on that portion is prevented from contact with fused solder similarly formed on the adjacent lands. In this case, however, the reduced amount of solder presents another grave problem in that any desired soldering strength is not obtained.

The first object of the present invention is to provide a water-soluble preflux that enables fused solder to be well wetted to and spread over a soldering land array in general and a soldering land array having a narrow spacing in particular, a printed circuit board, and a surface treatment process for a metal on a printed circuit board.

The second object of the present invention is to provide a water-soluble preflux that enables fused solder to be well wetted to and spread over a soldering land array which degrades upon heated to high temperature for the purpose of double-sided mounting, etc., a printed circuit board, and a surface treatment process for a metal on a printed circuit board.

The third object of the present invention is to provide a water-soluble preflux that can cut down on the incidence of soldering bridges and ensures sufficient soldering strength so that defects upon soldering can be reduced with productivity improvements, a printed circuit board, and a surface treatment process for a metal on a printed circuit board.

The fourth object of the present invention is to provide a water-soluble preflux that enables a benzimidazole-based compound to be solubilized without recourse to an ordinarily used acid, a printed circuit board, and a surface treatment process for a metal on a printed circuit board.

The fifth object of the present invention is to provide a water-soluble preflux that can form a film having much more improved humidity resistance even after exposed to high humidity and is much more improved in terms of protection of a printed circuit board and solderability at the time of part mounting, a printed circuit board, and a surface treatment process for a metal on a printed circuit board.

The sixth object of the present invention is to provide a water-soluble preflux that is free from defects that when an acid employed so far as a solubilizer is used, there is a soldering strength drop due to oxidation of solder, erosion of lead, etc., a printed circuit board, and a surface treatment process for a metal on a printed circuit board.

The seventh object of the present invention is to provide a water-soluble preflux to which a production process and a utilization process similar to those for conventional water-soluble prefluxes using benzimidazole-based compounds, a printed circuit board, and a surface treatment process for a metal on a printed circuit board.

The eighth object of the present invention is to provide a water-soluble preflux that can prevent each of the components used from becoming instable due to temperature changes and working environments from becoming worse due to volatile acids, a printed circuit board, and a surface treatment process for a metal on a printed circuit board.

As a result of intensive studies made to attain the aforesaid objects, the inventors have found that if the wetting coverage of fused solder with respect to soldering lands with a water-soluble preflux film coated thereon is enlarged, it is then possible to obtain the given soldering strength even when the amount of fused solder, i.e., the amount of the solder paste to be coated is reduced, and prevent fused solder on a certain soldering land from coming into contact with similar fused solder on the adjacent soldering lands, thereby avoiding any soldering bridge. Such findings have underlain the present invention.

SUMMARY OF THE INVENTION

According to the first aspect of the invention, there is provided a water-soluble preflux comprising at least one compound selected from the group consisting of compounds represented by the following general formulae (1) and (3), at least one compound having the following general formula (2), and an iodine-based compound.

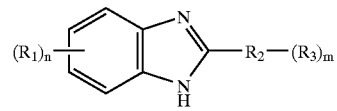

Formula (1)

Here $R_1$ is a straight-chain or branched-chain alkyl group having 1 to 7 carbon atoms, a halogen atom, an amino group, a di-lower alkylamino group, a hydroxy group, a lower alkoxy group, a cyano group, an acetyl group, a benzoyl group, a carbamoyl group, a formyl group, a carboxyl group, a lower alkoxycarbonyl group or a nitro group with the proviso that when $R_1$ represents two or more groups, they may be different from or identical with each other, $R_2$ is a straight-chain or branched-chain alkyl group, $R_3$ is a phenyl group or an alkylphenyl group with the proviso that when $R_3$ represents two or more groups, they may be different from or identical with each other, n is an integer of 0 to 4, and m is an integer of 0 to 3.

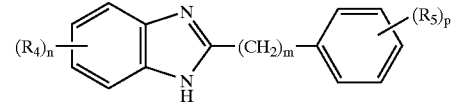

Formula (2)

Here each of $R_4$ and $R_5$ is a straight-chain or branched-chain alkyl group having 1 to 7 carbon atoms, a halogen atom, an amino group, a di-lower alkylamino group, a hydroxy group, a lower alkoxy group, a cyano group, an acetyl group, a benzoyl group, a carbamoyl group, a formyl group, a carboxyl group, a lower alkoxycarbonyl group or a nitro group with the proviso that when $R_4$ represents two or more groups, they may be different from or identical with each other, $R_5$ may be a straight-chain or branched-chain alkyl group, a phenyl group, an alkylphenyl group or a phenylalkyl group with the proviso that when $R_5$ represents two or more groups, they may be different from or identical with each other, n is an integer of 0 to 4, m is an integer of 0 to 10, and p is an integer of 0 to 4.

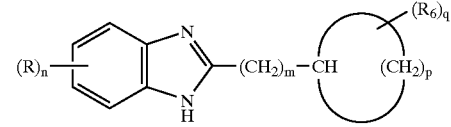

Formula (3)

Here R is a straight-chain or branched-chain alkyl group having 1 to 7 carbon atoms with the proviso that when R represents two or more groups, they may be different from or identical with each other, $R_6$ is a straight-chain or branched-chain alkyl group having 1 to 7 carbon atoms with the proviso that when $R_6$ represents two or more groups, they may be different from or identical with each other, n is an integer of 0 to 3, m is an integer of 0 to 4, p is an integer of 0 to 3, and q is an integer of 0 to 4.

According to the second aspect of the invention, there is provided a water-soluble preflux comprising at least one compound selected from the group consisting of compounds represented by the aforesaid formulae (1) and (3), at least one compound represented by the aforesaid general formula (2), an iodine-based compound, and an amine-based compound.

According to the third aspect of the invention, there is provided a preflux of the first or second aspect, wherein the ratio of at least one compound selected from the group consisting of compounds represented by the aforesaid general formulae (1) and (3) used with respect to at least one compound represented by the aforesaid general formula (2) is in the range of 0.5 to 5 on a mass basis.

According to the fourth aspect of the invention, there is provided a water-soluble preflux of the second or third aspect, wherein the amine-based compound is a solubilizer comprising at least one of heterocyclic rings having a ring containing a primary amino group, a secondary amino group, a tertiary amino group and a nitrogen atom capable of forming an insoluble salt with at least one compound selected from the group consisting of compounds represented by the aforesaid general formulae (1) and (3) and at least one compound represented by the aforesaid general formula (2) and having an acidic group.

According to the fifth aspect of the invention, there is provided a water-soluble preflux of any one of the first to fourth aspects, wherein the iodine-base compound is at least one selected from the group consisting of hydriodic acid, a metal salt of hydriodic acid and an iodized organic acid.

According to the sixth aspect of the invention, there is provided a water-soluble preflux of the fourth or fifth aspect, wherein the solubilizer comprises at least one compound selected from the group consisting of compounds represented by the following general formulae (11) to (16), L-theanine, pyroglutamic acid, pyrolidine-2,4-dicarboxylic acid, folic acid, DL-threonine, L-threonine, L-tryptophan, L-phenylalanine and quinaldinic acid and their derivatives.

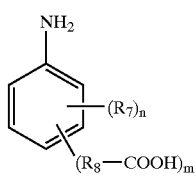

Formula (11)

Here $R_7$ is a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_7$ represents two or more groups, they may be different from or identical with each other, $R_8$ may be zero, and is a straight-chain or branched-chain alkylene group having 1 to 20 carbon atoms with the proviso that when $R_8$ represents two or more groups, they may be different from or identical with each other, n is an integer of 0 to 4, and m is an integer of 1 to 5.

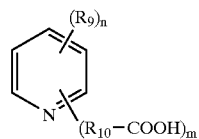

Formula (12)

Here $R_9$ is a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_9$ represents two or more groups, they may be different from or identical with each other, $R_{10}$ may be zero, and is a straight-chain or branched-chain alkylene group having 1 to 20 carbon atoms with the proviso that when $R_{10}$ represents two or more groups, they may be different from or identical with each other, n is an integer of 0 to 4, and m is an integer of 1 to 5.

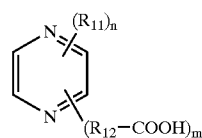

Formula (13)

Here $R_{11}$ is a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_{11}$ represents two or more groups, they may be different from or identical with each other, $R_{12}$ may be zero, and is a straight-chain or branched-chain alkylene group having 1 to 20 carbon atoms with the proviso that when $R_{12}$ represents two or more groups, they may be different from or identical with each other, n is an integer of 0 to 3, and m is an integer of 1 to 4.

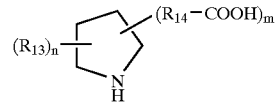

Formula (14)

Here $R_{13}$ is a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_{13}$ represents two or more groups, they may be different from or identical with each other, $R_{14}$ may be zero, and is a straight-chain or branched-chain alkylene group having 1 to 20 carbon atoms with the proviso that when $R_{12}$ represents two or more groups, they may be different from or identical with each other, n is an integer of 0 to 3, and m is an integer of 1 to 4.

$(R_{15})_n$—N—$(R_{16}$—COOH$)_m$    Formula (15)

Here $R_{15}$ is a hydrogen atom, a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_{15}$ represents two or more groups, they may be different from or identical with each other, $R_{16}$ may be zero, and is a straight-chain or branched-chain alkylene group having 1 to 20 carbon atoms with the proviso that when $R_{16}$ represents two or more groups, they may be different from or identical with each other, n is an integer of 0 to 2, and m is an integer of 1 to 3.

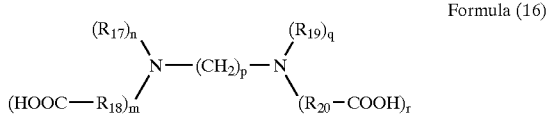

Formula (16)

Here $R_{17}$ is a hydrogen atom, a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_{17}$ represents two groups, they may be different from or identical with each other, $R_{19}$ is a hydrogen atom, a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_{19}$ represents two groups, they may be different from or identical with each other, $R_{18}$ may be zero, and is a straight-chain or branched-chain alkylene group having 1 to 20 carbon atoms with the proviso that when $R_{18}$ represents two groups, they may be different from or identical with each other, $R_{20}$ may be zero, and is a straight-chain or branched-chain alkylene group having 1 to 20 carbon atoms with the proviso that when $R_{20}$ represents two groups, they may be different from or identical with each other, n is an integer of 0 to 2, m is an integer of 0 to 2, p is an integer of 0 to 4, q is an integer of 0 to 1, and r is an integer of 1 to 2.

According to the seventh aspect of the invention, there is provided a printed circuit board having a metal layer for a circuit pattern on its surface, wherein said metal layer comprises a film of a water-soluble preflux as recited in any one of the aforesaid first to sixth aspects.

According to the eighth aspect of the invention, there is provided a surface treatment process for a metal in a printed circuit board, wherein a metal layer for a circuit pattern on a printed circuit board is subjected to rust-preventive treatment by a step of coating thereon a water-soluble preflux as recited in any one of the aforesaid first to sixth aspects.

DETAILED DESCRIPTION OF THE INVENTION

In the present invention, the preferable compounds belonging to the aforesaid general formula (1), for instance, include those represented by the following general formula (4).

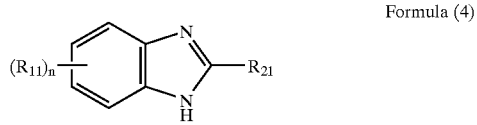

Formula (4)

Here $R_{11}$ is a straight-chain or branched-chain alkyl group having 1 to 7 carbon atoms, a halogen atom, an amino group, a di-lower alkylamino group, a hydroxy group, a lower alkoxy group, a cyano group, an acetyl group, a benzoyl group, a carbamoyl group, a formyl group, a carboxyl group, a lower alkoxycarbonyl group or a nitro group with the proviso that when $R_{11}$ represents two or more groups, they may be different from or identical with each other, $R_{21}$ is a straight-chain or branched-chain alkyl group having 1 to 20 carbon atoms, and n is an integer of 0 to 4.

Of the compounds belonging to this general formula (4), preference is given to those represented by the following general formula (5) as well as those represented by the following general formulae (6) and (7) belonging to this general formula (5).

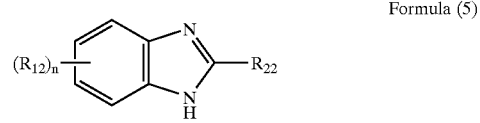

Formula (5)

Here $R_{12}$ is a lower alkyl group with the proviso that when $R_{12}$ represents two groups, they may be different from or identical with each other, $R_{22}$ is a straight-chain or branched-chain alkyl group having 3 to 17 carbon atoms, and n is an integer of 1 to 2.

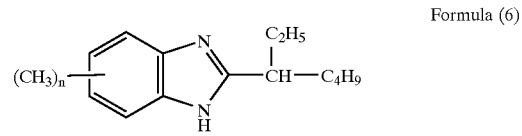

Formula (6)

Here n is an integer of 0 to 3.

2-(1-ethylpentyl)benzimidazole, 2-(1-ethylpenthyl)tosylimidazole and 2-(1-ethylpentyl)xylylimidazole are exemplified.

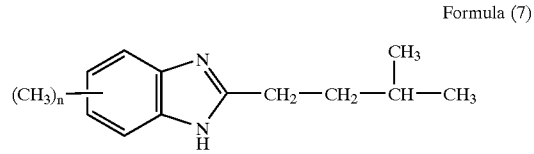

Formula (7)

Here n is an integer of 0 to 3.

2-(3-methylbutyl)benzimidazole, 2-(3-methylbutyl)tosylimidazole and 2-(3-methylbutyl)xylylimidazole are exemplified.

Other exemplary compounds belonging to the general formula (5), for instance, include 2-n-propyl-methylbenzimidazole, 2-n-propyl-dimethylbenzimidazole, 2-n-butyl-methylbenz-imidazole, 2-n-butyl-dimethylbenzimidazole, 2-n-pentyl-methylbenzimidazole, 2-n-pentyl-dimethylbenzimidazole, 2-n-hexyl-methylbenzimidazole, 2-n-hexyl-dimethylbenz-imidazole, 2-n-heptyl-methylbenzimidazole, 2-n-heptyl-dimethylbenzimidazole, 2-n-octyl-methylbenzimidazole, 2-n-octyl-dimethylbenzimidazole, 2-n-nonyl-methylbenzimidazole, 2-n-nonyl-dimethylbenzimidazole, 2-n-decyl-methylbenz-imidazole, 2-n-decyl-dimethylbenzimidazole, 2-n-undecyl-methylbenzimidazole, 2-n-undecyl-dimethylbenzimidazole, 2-n-dodecyl-methylbenzimidazole, 2-n-dodecyl-dimethylbenz-imidazole, 2-n-tridecyl-methylbenzimidazole, 2-n-tridecyl-dimethylbenzimidazole, 2-n-tetradecyl-methylbenzimidazole, 2-n-tetradecyl-dimethylbenzimidazole, 2-n-pentadecyl-methylbenzimidazole, 2-n-pentadecyl-dimethylbenzimidazole, 2-n-hexadecylmethylbenzimidazole, 2-n-hexadecyl-dimethyl-benzimidazole, 2-n-heptadecyl-methylbenzimidazole, 2-n-heptadecyl-dimethylbenzimidazole, 2-isopropyl-methylbenz-imidazole, 2-isopropyl-dimethylbenzimidazole, 2-isobutyl-methylbenzimidazole, 2-isobutyl-dimethylbenzimidazole, 2-sec-butyl-methylbenzimidazole, 2-sec-butyl-dimethylbenz-imidazole, 2-tert-butyl-methylbenzimidazole, 2-tert-dimethylbenzimidazole, 2-isopentyl-methylbenzimidazole, 2-isopentyl-dimethylbenzimidazole, 2-neopentyl-methylbenz-imidazole, 2-neopentyl-dimethylbenzimidazole, 2-tert-phenyl-methylbenzimidazole, 2-tert-phenyl-dimethylbenzimidazole, 2-isohexyl-methylbenzimidazole and 2-isohexyl-dimethylbenzimidazole.

Preferred compounds that belong to the general formula (4) not encompassed in the aforesaid general formulae (5) to (7), for instance, include 6-ethoxy-2-isopropylbenzimidazole, 6-amino-2-isooctylbenz-imidazole, 4,6-diacetyl-2-isobutylbenzimidazole, 4-benzoyl-6-carbamoyl-2-n-propylbenzimidazole, 4,7-dimethoxycarbonyl-2-n-eicosabenzimidazole, 6-methoxy-carbonyl-2-isopropylbenzimidazole, 4,5-dimethyl-7-acetyl-2-hexylbenzimidazole, 4-chloro-6-n-heptyl-7-methoxy-2-ethylbenzimidazole, 4,6-difluoro-5-formyl-2-n-nonylbenzimidazole and 6-carbamoyl-4,7-diethoxy-2-isobutylbenzimidazole as well as their salts.

More preferable compounds belonging to the aforesaid general formulae (1) and (4) to (7), for instance, include 6-methyl-2-n-propylbenzimidazole, 4,5,6,7-tetramethyl-2-n-hexylbenzimidazole, 4,5,6,7-tetramethyl-2-n-propylbenz-imidazole, 2-(3-methylbutyl)methylbenzimidazole, 2-(3-methylbutyl)dimethylbenzimidazole, 2-(3-methylbutyl)benz-imidazole, 2-(1-ethylpentyl)benzimidazole, 2-(1-ethylpentyl)tosylimidazole, 2-(1-methylpropyl)benzimidazole, 5,6-dichloro-2-n-hexylbenzimidazole, 6-diethylamino-2-n-decylbenzimidazole, 6-hydroxy-2-n-eicosabenzimidazole, 4,7-dicyano-2-n-octylbenzimidazole, 6-nitro-2-ethylbenzimidazole and compounds shown in Tables 1 and 2 given below.

Of the aforesaid compounds, 6-methyl-2-n-propylbenz-imidazole, 4,5,6,7-tetramethyl-2-n-propylbenzimidazole, 5,6-dichloro-2-n-hexylbenzimidazole, 6-diethylamino-2-n-decylbenzimidazole, 6-hydroxy-2-n-eicosabenzimidazole, 4,7-dicyano-2-n-octylbenzimidazole and 6-nitro-2-ethyl-benzimidazole belong to the general formula (4) not encompassed in the aforesaid general formulae (5) to (7).

TABLE 1

| Benzimidazole Compounds |
|---|
| 1  2-n-propyl-methylbenzimidazole |
| 2  2-n-propyl-dimethylbenzimidazole |
| 3  2-n-butyl-methylbenzimidazole |
| 4  2-n-butyl-dimethylbenzimidazole |
| 5  2-n-pentyl-methylbenzimidazole |
| 6  2-n-pentyl-dimethylbenzimidazole |
| 7  2-n-hexyl-methylbenzimidazole |
| 8  2-n-hexyl-dimethylbenzimidazole |
| 9  2-n-heptyl-methylbenzimidazole |
| 10 2-n-heptyl-dimethylbenzimidazole |
| 11 2-n-octyl-methylbenzimidazole |
| 12 2-n-octyl-dimethylbenzimidazole |
| 13 2-n-nonyl-methylbenzimidazole |
| 14 2-n-nonyl-dimethylbenzimidazole |
| 15 2-n-decyl-methylbenzimidazole |
| 16 2-n-decyl-dimethylbenzimidazole |
| 17 2-n-undecyl-methylbenzimidazole |
| 18 2-n-undecyl-dimethylbenzimidazole |
| 19 2-n-dodecyl-methylbenzimidazole |

TABLE 1-continued

| Benzimidazole Compounds |
|---|
| 20 2-n-dodecyl-dimethylbenzimidazole |
| 21 2-n-tridecyl-methylbenzimidazole |
| 22 2-n-tridecyl-dimethylbenzimidazole |
| 23 2-n-tetradecyl-methylbenzimidazole |
| 24 2-n-tetradecyl-dimethylbenzimidazole |
| 25 2-n-pentadecyl-methylbenzimidazole |
| 26 2-n-pentadecyl-dimethylbenzimidazole |
| 27 2-n-hexadecyl-methylbenzimidazole |
| 28 2-n-hexadecyl-dimethylbenzimidazole |
| 29 2-n-heptadecyl-methylbenzimidazole |
| 30 2-n-heptadecyl-dimethylbenzimidazole |

TABLE 2

| Benzimidazole Compounds |
|---|
| 1  2-(2-methylethyl)-benzimidazole |
| 2  2-(2-methylpropyl)-benzimidazole |
| 3  2-(1-methylbutyl)-benzimidazole |
| 4  2-(1-ethylpropyl)-benzimidazole |
| 5  2-(1-ethylpropyl)-methybenzimidazole |
| 6  2-(2-metylbutyl)-benzimidazole |
| 7  2-(3-methylbutyl)-benzimidazole |
| 8  2-(1-methylpentyl)-benzimidazole |
| 9  2-(1-propylbutyl)-benzimidazole |
| 10 2-(1-ethylpentyl)-benzimidazole |
| 11 2-(1-ethylpentyl)-methylbenzimidazole |
| 12 2-(1-ethylpentyl)-dimethylbenzimidazole |
| 13 2-(2-methyl-4,4-dimethylpentyl)-benzimidazole |
| 14 2-n-butyl-methylbenzimidazole |
| 15 2-n-butyl-benzimidazole |
| 16 2-n-pentyl-benzimidazole |
| 17 2-n-hexyl-benzimidazole |
| 18 2-n-heptyl-benzimidazole |
| 19 2-n-octyl-benzimidazole |
| 20 2-n-nonyl-benzimidazole |
| 21 2-n-nonyl-methylbenzimidazole |
| 22 2-n-nonyl-dimethylbenzimidazole |
| 23 2-(2,2,3,3)-tetramethylpropyl)-benzimidazole |

In the present invention, the preferred compounds belonging to the aforesaid general formula (2) are represented by the following general formula (8).

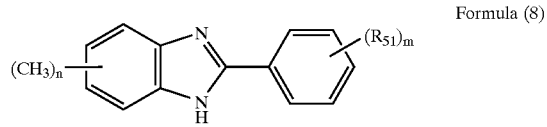

Formula (8)

Here $R_{51}$ is an alkyl group, a phenyl group, an alkylphenyl group and a phenylalkyl group with the proviso that when $R_{51}$ represents two or more groups, they may be different from or identical with each other, n is an integer of 0 to 3, and m is an integer of 0 to 3.

Compounds having the following general formula (9), too, are exemplified as the preferred compounds belonging to the aforesaid formula (2).

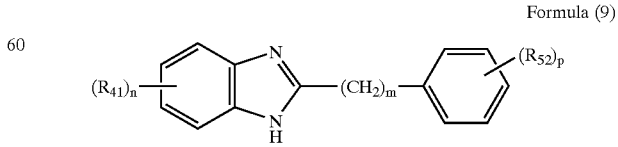

Formula (9)

Here $R_{41}$ is a straight-chain or branched-chain alkyl group having 1 to 7 carbon atoms, a halogen atom, an amino group, a hydroxy group, a cyano group, a nitro group, a lower alkoxy group, an acetyl group, a benzoyl group, a carbamoyl group, a lower alkoxycarbonyl group, a formyl group or a carboxyl group with the proviso that when $R_{41}$ represents two or more groups, they may be different from or identical with each other, $R_{52}$ is a straight-chain or branched-chain alkyl group having 1 to 7 carbon atoms, a halogen atom, an amino group, a hydroxy group, a cyano group, a nitro group, a lower alkoxy group, an acetyl group, a benzoyl group, a carbamoyl group, a lower alkoxycarbonyl group, a formyl group or a carboxyl group with the proviso that when $R_{52}$ represents two or more groups, they may be different from or identical with each other, n and p are each an integer of 0 to 4, and m is an integer of 0 to 10.

The preferred compounds belonging to this formula (9) are exemplified by those having the following general formula (10).

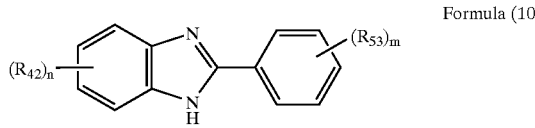

Formula (10)

Here $R_{42}$ is a lower alkyl group with the proviso that when $R_{42}$ represents two groups, they may be different from or identical with each other, $R_{53}$ is a lower alkyl group with the proviso that when $R_{53}$ represents two groups, they may be different from or identical with each other, n and m are each an integer of 0 to 2.

Exemplary compounds are 2-phenyl-methylbenzimidazole, 2-phenyl-dimethylbenzimidazole, 2-tosyl-methylbenz-imidazole, 2-tosyl-dimethylbenzimidazole, 2-xylyl-methyl-benzmidazole, 2-xylyl-dimethylbenzimidazole, 2-mesityl-dimethylbenzimidazole and 2-mesityl-methylbenzimidazole.

Other preferable exemplary compounds belonging to the aforesaid general formula (9) are 2-(8-phenylocytl)benzimidazole, 5,6-dimethyl-2-(2-phenylethyl)benzimidazole, 4-chloro-2-(3-phenylporpyl)benzimidazole, 6-dimethylamino-2-(9-phenylnonyl)benzimidazole, 4,7-dihydroxy-2-benzyl-benzimidazole, 4-cyano-2-(6-phenylhexyl)benzimidazole, 5,6-dinitro-2-benzylbenzimidazole, 4,7-diethoxy-2-(2-henylethyl)benzimidazole, 6-amino-2-(4-phenylbutyl)benzimidazole, 6-acetyl-2-benzyl-benzimidazole, 4-benzoyl-2-(5-phenylpentyl)benzimidazole, 6-carbamoyl-2-(7-phenylheptyl)benzimidazole, 6-ethoxycarbonyl-2-benzylbenzimidazole, 4,5,6-trimethoxy-2-(2-phenylethyl)benzimidazole, 5,6-dimethyl-7-benzoyl-2-(3-phenylpropyl)benzimidazole, 4,5-dichloro-6-n-butyl-2-(9-phenylnonyl)benzimidazole, 4-fluoro-6-formyl-2-benzyl-benzimidazole, 6-carbamoyl-5-ethoxy-2-(10-phenyldecyl)benzimidazole, 5,6-dimethyl-2-{(4-methoxyphenyl)butyl}benzimidazole, 6-chloro-2-{(2-nitrophenyl)ethyl}benzimidazole, 6-carboethoxy-2-(3-buromobenzyl)benz-imidazole, 4-hydroxy-2-{(4-cyanophenyl)propyl}benz-imidazole, 6-dimethylamino-2-{(4-formylphenyl)propyl}benz-imidazole, 6-benzoyl-2-{(4-tert-butylphenyl)ethyl}benz-imidazole, 2-{2-acetylphenyl)pentyl}benzimidazole and 6-carbamoyl-2-{(2,4-dihydroxyphenyl)ethyl}benzimidazole.

More preferred compounds belonging to the aforesaid general formulae (2) and (8) to (10), for instance, are 2-(8-phenyloctyl)benzimidazole, 4-chloro-2-(3-phenypropyl)benzimidazole, 6-dimethylamino-2-(9-phenylnonyl)benz-imidazole, 4,7-dihydroxy-2-benzylbenzimidazole, 4-cyano-2-(6-phenylhexyl)benzimidazole, 5,6-dinitro-2-benzylbenz-imidazole, 4,7-diethoxyl-2-(2-phenylethyl)benzimidazole, 5,6-dimethyl-2-{(4-methoxyphenyl)butyl}benzimidazole, 6-chloro-2-{(2-nitrophenyl)ethyl}benzimidazole, 6-carboethoxy-2-(3-bromobenzyl)benzimidazole, 4-hydroxy-2-{(4-cyanophenyl)propyl}benzimidazole, 6-dimethylamino-2-{(4-formylphenyl)propyl}benzimidazole, 6-benzoyl-2{(4-tert-butylphenyl)ethyl}benzimidazole, 2-{(2-acetylphenyl)pentyl}benzimidazole, 6-carbamoyl-2-{(2,4-dihydroxyphenyl)ethyl}benzimidazole and 5,6-dimethyl-2-(2-phenylethyl)benzimidazole as well as compounds enumerated in Tables 3 and 4 given just below.

TABLE 3

| Benzimidazole Compounds |
| --- |
| 1 2-phenylmethyl-methylbenzimidazole |
| 2 2-phenylmethyl-dimethylbenzimidazole |
| 3 2-tosyl-methylbenzimidazole |
| 4 2-tosyl-dimethylbenzimidazole |
| 5 2-xylyl-methylbenzimidazole |
| 6 2-xylyl-dimethylbenzimidazole |
| 7 2-mesityl-methylbenzimidazole |
| 8 2-mesityl-dimethylbenzimidazole |
| 9 2-tert-phenyl-methylbenzimidazole |
| 10 2-tert-phenyl-dimethylbenzimidazole |

TABLE 4

| Benzimidazole Compounds |
| --- |
| 1 2-(4-tert-butylphenyl)-benzimidazole |
| 2 2-(4-hexylphenyl)-benzimidazole |
| 3 2-(2,4,6-trimethylphenyl)-benzimidazole |
| 4 2-(4-butylphenyl)-benzimidazole |
| 5 2-(4-pentylphenyl)-benzimidazole |
| 6 2-(4-hexylphenyl)-benzimidazole |
| 7 2-(2-phenylethyl)-benzimidazole |
| 8 2-(2-phenylethyl)-methylbenzimidazole |
| 9 2-(4-ethylphenyl)-benzimidazole |
| 10 2-tosyl-benzimidazole |
| 11 2-(2-biphenyl)-benzimidazole |
| 12 2-(4-biphenyl)-benzimidazole |
| 13 2-(2-benzylphenyl)-benzimidazole |
| 14 2-(2-phenetylphenyl)-benzimidazole |
| 15 2-(4-ethyl-4-biphenyl)-benzimidazole |
| 16 2-(1-phenyl-2-methylbutyl)-benzimidazole |
| 17 2-(1-phenylpropyl)-benzimidazole |
| 18 2-{1-(4-isobutylphenyl)ethyl}-benzimidazole |
| 19 2-(1,1-diphenylmethyl)-benzimidazole |
| 20 2-(1,1-diphenylethyl)-benzimidazole |
| 21 2-(2,2-diphenylethyl)-benzimidazole |
| 22 2-triphenylmethyl-benzimidazole |
| 23 2-(2,2,2-triphenylethyl)-benzimidazole |
| 24 2-(4-phenylbutyl)-benzimidazole |
| 25 2-(5-phenylpentyl)-benzimidazole |
| 26 2-(3-phenylpropyl)-benzimidazole |
| 27 2-(2-phenylpropyl)-benzimidazole |
| 28 2-(1-phenylethyl)-benzimidazole |
| 29 2-n-phenylmethyl-benzimidazole |

In the present invention, more preferred compounds included in the aforesaid general formula (3), for instance, are those listed in the following Table 5. It is here preferred that R be a methyl group and n be an integer of 0 to 2.

TABLE 5

Benzimidazole Compounds 1. 2-cyclobutyl-benzimidazole
2. 2-cyclopentyl-benzimidazole
3. 2-cyclohexyl-benzimidazole
4. 2-cyclohexyl-methylbenzimidazole
5. 2-cyclohexyl-dimethylbenzimidazole
6. 2-cyclobutyl-benzimidazole
7. 2-(1-cycloheptyl)-benzimidazole
8. 2-(1-methylcyclopropyl)-benzimidazole
9. 2-(2-methylcyclopropyl)-benzimidazole
10. 2-(1-methylcyclohexyl)-benzimidazole
11. 2-(2-methylcyclohexyl)-benzimidazole
12. 2-(3-methylcyclohexyl)-benzimidazole
13. 2-(4-methylcyclohexyl)-benzimidazole
14. cyclopentyl-methylbenzimidazole
15. 2-(2-cyclopentylethyl)-benzimidazole
16. 2-(2-cyclohexylethyl)-benzimidazole
17. 2-(3-cyclohexylpropyl)-benzimidazole In the present invention, at least one compound selected from the group consisting of the compounds represented by the aforesaid general formulae (1) and (3) is used in combination with at least one compound represented by the aforesaid general formula (2). Accordingly, the compounds belonging to the aforesaid generally formulae included in the aforesaid respective general formulae as well as exemplary compounds thereof, too, may be used in combination. At least one compound selected from the group consisting of those represented by the aforesaid general formulae (1) and (3) should be used in the proportion on a mass basis of 1:2 to 5:1, and preferably 1:1 to 3:1 with respect to at least one compound represented by the aforesaid general formula (2). In other words, the former-to-latter ratio should be in the range of 0.5 to 5, and preferably 1 to 3. When the amount of the former compound is larger than that upper limit or the amount of the latter is smaller than that lower limit, a protective film can be more easily formed and so a thicker film can be formed on a copper foil. Too thick a film is a less-soluble, difficult-to-remove flux fraction that may otherwise cause nonwetting of solder. Conversely, when the amount of the former compound is smaller than that lower limit or the amount of the latter is larger than that upper limit, the formation of a protective film can be less likely, and so the effect on prevention of oxidation of the copper foil becomes slender on account of the formation of a defective film, again resulting in possible nonwetting of solder even when some flux is used.

In the present invention, the wetting coverage and solderability of fused solder upon fusion of a solder paste film can be improved by using an iodine-based compound in combination with the benzimidazole compound. Exemplary iodine-based compounds are hydriodic acid or its metal salts such as its alkaline metal salts, e.g., potassium iodide and its heavy metal salts, e.g., zinc iodide and copper iodide, and an iodized organic acid, for instance, an iodized lower aliphatic monobasic acid such as iodopropionic acid and its polybasic acid.

It is preferred that the iodine-based compound be added in an amount of 0.05% to 5% into the water-soluble preflux. In the present disclosure, "%" is given by mass.

To enhance the solubility of the iodine-based compound and increase the amount of the iodine-based compound to be added, it should preferably be used in combination with an amine-based compound, especially an amine-based compound containing an acidic group such as amino acid, thereby making much better the wetting coverage and solderability of fused solder upon fusion of a solder paste film.

This amine-based compound should preferably be added in an amount of 0.01% to 3% into the water-soluble preflux.

For the amine-based compound containing an acidic group, it is acceptable to make use of the following compounds referred to as solubilizers.

For use, the water-soluble preflux is conveniently placed in a state wherein the so-called benzimidazole compounds represented by the aforesaid general formulae (1) to (10) are dissolved or emulsified in solvents, for which water or water-miscible solvents or mixtures of such solvents may be exemplified. In this case, acids are used as solubilizers because the benzimidazole compounds are generally insoluble in water. For such acids, it is preferable to use compounds having at least one of hetero-cyclic rings including rings containing a primary amino group, a secondary amino group, a tertiary amino group and a nitrogen atom capable of forming a water-soluble salt of the acids and having an acidic group. More preferably, however, use should be made of at least one compound selected from the group consisting of the compounds represented by the aforesaid general formulae (11) to (16), L-theanine, pyroglutamic acid, pyrrolidine-2,4-dicarboxylic acid, folic acid, DL-threonine, L-threonine, L-tryptophan, L-phenylalanine and quinaldinic acid as well as their derivatives. Exemplary compounds represented by the aforesaid general formulae (11) to (16), L-theanine and so on are listed in order in the following Tables 6 to 12.

TABLE 6

| | |
|---|---|
| (structure with NH₂ and COOH on benzene ring) | anthranilic acid |

TABLE 7

| | |
|---|---|
| (pyridine with COOH at 4-position) | isonicotinic acid |
| (pyridine with COOH and Cl) | 2-chloronicotinic acid |
| (pyridine with OH, HOOC and COOH) | chelidamic acid |
| (pyridine with COOH, HO and OH) | citrazinic acid |

TABLE 7-continued

| Structure | Name |
|---|---|
| (pyridine with CH2COOH at 3-position) | 3-pyridineacetic acid |
| (pyridine with COOH at 2-position) | picolinic acid |
| (pyridine with COOH at 3-position) | nicotinic acid |

TABLE 8

| Structure | Name |
|---|---|
| (pyrazine with two COOH at 2,3) | 2,3-pyradinecarboxylic acid |
| (pyrazine with one COOH) | pyradinemonocarboxylic acid |

TABLE 9

| Structure | Name |
|---|---|
| (pyrrolidine with two COOH at 2,4) | pyrrolidine-2,4-carboxylic acid |

TABLE 10

| Structure | Name |
|---|---|
| $CH_3-CH(NH_2)-COOH$ | alanine |
| $HOOCCH_2CH_2-CH(NH_2)-COOH$ | L-glutamic acid |
| $NH_2-(CH_2)_2-COOH$ | γ-aminobutyric acid |
| $NH_2-(CH_2)_3-COOH$ | ε-aminocaproic acid |
| $HOOC-CH(NH_2)-CH_2COOH$ | L-aspartic acid |
| $NH_2-(CH_2)_{11}-COOH$ | aminododecanoic acid |
| $HN(CH_2COOH)_2$ | iminodiacetic acid |

TABLE 11

| Structure | Name |
|---|---|
| $(HOOCCH_2)_2N-C_2H_4-N(CH_2COOH)_2$ | ethylenediaminetetraacetic acid |

TABLE 12

| Structure | Name |
|---|---|
| $C_2H_5NH-CO-C_2H_4-CH(NH_2)-COOH$ | L-theanine |
| (pyrrolidinone with COOH) | pyroglutamic acid |
|  | folic acid |

TABLE 12-continued

| Structure | Name |
|---|---|
| H₃C—CH(OH)—CH(NH₂)—COOH | DL-threonine |
| H₃C—CH(OH)—CH(NH₂)—COOH | L-threonine |
| Indole-CH₂—CH(NH₂)—COOH | L-tryptophan |
| Phenyl-CH₂—CH(NH₂)—COOH | L-phenylalanine |
| Quinoline-2-COOH | quinaldinic acid |

These acidic group-containing amine-based compounds may be used in combination of two or more. These compounds, when used as solubilizers, are added in an amount of 0.01 to 20%, and preferably 0.1 to 5% to water.

More preferable among these compounds are alanine, aminododecanoic acid, imiodiacetic acid and anthranilic acid.

Using the aforesaid acidic acid-containing amine-base compound as the solubilizer is preferable because there is no erosion of a precoated solder layer for parts having a narrow pitch lead such as QFPs or a solder layer at the time of soldering. When the primary purpose of using the iodine-based compound is to improve the aforesaid wetting coverage and soliderability of solder, however, other currently available acids, too, may be used alone or in combination with the aforesaid amine-based compounds. To this end use may be made of organic acids such as formic acid, acetic acid, propionic acid, butyric acid, glycolic acid, lactic acid, chloroacetic acid, dichloroacetic acid, trichloroacetic acid, bromoacetic acid, dibromoacetic acid, fluoroacetic acid, difuloroacetic acid, trifluroacetic acid, oxalic acid, malonic acid, succinic acid, adipic acid, malic acid, tartaric acid, citric acid, maleic acid, fumaric acid, p-toluenesulfonic acid, methanesulfonic acid, and inorganic acids such as hydrochloric acid, sulfuric acid, phosphoric acid, phosphorous acid, hypophosphorous acid and nitric acid, among which formic acid and tartaric acid are more preferred.

The water-miscible solvent, for instance, may be any solvent capable of being mixed with water or any solvent of high solubility in water. Exemplary solvents, which may be added in suitable amounts if required, are methanol, ethanol, isopropanol, butanol, acetone, methyl ethyl ketone, tetrahydrofuran, dioxane, dimethylsulfoxide and dimethylformamide.

The content of the aforesaid benzimidazole compound of the invention in the water-soluble preflux according to the invention should be in the range of 0.05 to 30%, and preferably 0.1 to 5%. At less than 0.05% any effective rust-preventive film cannot be formed, and at greater than 30% much insolubles remain and any economical merit is not achieved.

In addition, the water-soluble preflux according to the present invention contain an additive for assisting in the formation of a complex film with copper, which is exemplified by metal compounds such as copper formate, cupric chloride, cuprous chloride, copper oxalate, copper acetate, copper hydroxide, copper oxide, cuprous oxide, cupric oxide, copper carbonate, copper phosphate, copper sulfate, manganese formate, manganese chloride, manganese oxalate, manganese sulfate, lithium, beryllium, potassium, magnesium, zinc acetate, lead acetate, hydrogenated zinc, ferrous chloride, ferric chloride, ferrous oxide, ferric oxide, copper iodide, cuprous bromide and cupric bromide. These additives may be used alone or in combination of two or more, and added in an amount of 0.01 to 10%, and preferably 0.1 to 5% with respect to the treating solution. However, care must be taken of the use of the additive to form a complex with copper, because an additional film may be formed on gold plating on a printed circuit board although depending on conditions, resulting in discoloration of the gold plating.

It is also preferable to use a metal ion-containing buffer solution in which the aforesaid metal compound is used. Typical bases to this end, for instance, include ammonia, diethylamine, triethylamine, diethanolamine, triethanolamine, monoethanolamine, dimethylethanolamine, diethylethanolamine, isopropylethanolamine, sodium hydroxide and potassium hydroxide.

All things considered, it is preferable that the water-soluble preflux of the present invention should contain at least one compound selected from the group consisting of those represented by the aforesaid general formulae (1) and (3), at least one compound represented by the aforesaid general formula (2), the aforesaid iodine-based compound and at least one of the aforesaid metal compounds (or a buffer solution containing metal ions of at least one of the aforesaid metal compounds). More preferably, the water-soluble preflux of the invention should contain a solubilizer comprising at least one compound selected from the group consisting of the compounds represented by the aforesaid general formulae (11) to (16), L-theanine, pyroglutamic acid, pyrrolidine-2,4-dicarboxylic acid, folic acid, DL-threonine, L-threonine, L-tryptophan, L-phenylalanine and quinaldinic acid as well as their derivatives.

To coat the water-soluble preflux of the present invention on the printed circuit board to be subjected to rust-preventive treatment, so that a rust-preventive film is formed thereon, the surface of a copper layer in the printed circuit board is pretreated by polishing, degreasing, pickling and rinsing. Then, the printed circuit board is immersed in the water-soluble preflux at 0 to 100° C. for a few seconds to a few tens of minutes, and preferably at 20 to 50° C. for 5 seconds to 1 hour and preferably for 10 seconds to 10 minutes. The treating solution used herein should be acid or have a pH value of preferably up to 5.0 (not greater than 5.0).

Thus, the benzimidazole compound according to the present invention is deposited onto the copper layer. The higher the treating temperature and the longer the treating time, the more the amount of the compound deposited is. In this case, it is more preferable to make use of ultrasonic waves.

It is appreciated that other coating means, for instance, spraying, brushing or roller coating may also be used. The thus obtained rust-preventive film can exhibit extremely satisfactory solderability even at high temperature and high humidity.

One typical embodiment of the present invention wherein a printed circuit board is fabricated is now explained. This embodiment uses at least three steps as mentioned just below.

At the first step, a board comprising a copper-clad laminate board is provided by etching with a circuit pattern comprising predetermined circuit interconnections and including soldering lands for soldering a chip part to the board, and a solder resist is put over a portion of the board other than the soldering lands.

At the second step, the surface of copper under the circuit pattern is pretreated by polishing, degreasing, pickling (micro etching) and rinsing.

At the third step, the exposed surface of copper unders the soldering lands is coated with the water-soluble flux comprising at least one compound selected from the group consisting of those represented by the aforesaid general formulae (1) and (3), at least one compound represented by the aforesaid general formula (2) and at least one of the aforesaid iodine-based compounds, followed by drying. Preferably in this embodiment, this water-soluble preflux is solubilized by at least one of the compounds represented by the aforesaid formulae (11) to (16) or the like.

Thus, the obtained preflux film prevents oxidation of the copper surface and functions well as a rust-preventive film, even when the compounds contained in the water-soluble flux and represented by the aforesaid general formulae (1) to (16) or other compounds have acid roots. The resulting printed circuit board is coated at the aforesaid soldering lands with a solder paste (containing solder powders and a flux) with or without a post-flux coated thereon, so that the electrodes of the aforesaid chip part are soldered thereto by a reflow soldering process. It is here acceptable that a circuit board having a solder precoat layer and ordinary soldering lands is similarly coated or otherwise treated with the aforesaid water-soluble preflux, and the aforesaid chip part and a narrow-pitch part are located at given positions so that by means of a reflow soldering process, the lead of the narrow-pitch part is soldered to the solder precoat layer of a narrow-pitch pad and the electrodes of the aforesaid chip part are soldered to the aforesaid soldering land.

The present invention will now be explained more specifically with reference to some examples.

EXAMPLE 1

One (1.0) gram of 6-methyl-2-n-propylbenzimidazole, 1.0 gram of 2-phenyl-methylbenzimidazole, 0.1 gram of copper sulfate, 0.5 gram of potassium iodide and 0.1 gram of 25% ammonia water were added and incorporated in this order into 100 grams of a 2% by mass aqueous solution of formic acid, thereby preparing a water-soluble preflux.

Immersed at 50° C. for 2 minutes in this water-soluble preflux was a test piece that was obtained by cleaning a JIS Z 3197 prescribed comb board (having copper foil electrodes) by degreasing, soft etching and rinsing.

After this, the test piece was rinsed with water, and then dried in warm air, whereupon the test piece was passed through an air reflow furnace where it was heated once, twice, and thrice to force the copper foil surface to degrade. A solder paste (comprising solder powders of Sn/Pb=63/37 and a flux containing rosin and an activator) was fed by a printing process to each test piece subjected to degradation-by-heating treatment and a test piece not subjected to degradation-by-heating treatment, which were then heated through an air reflow furnace so that the solder powders were fused as in the case of actual soldering, and then cooled down. The length of the wetting coverage of solder over the copper foil of the post-cooling test piece was measured. The results are shown in Table 13.

EXAMPLE 2

The length of the wetting coverage of fused solder powders was measured as in Example 1 with the exception that 2-n-octylbenzimidazole was used instead of 6-methyl-2-n-propylbenzimidazole. The results are shown in Table 13.

EXAMPLE 3

The length of the wetting coverage of fused solder powders was measured as in Example 1 with the exception that 4-chloro-2-(3-phenylpropyl)benzimidazole was used in place of 2-phenyl-methylbenzimidazole. The results are shown in Table 13.

EXAMPLE4

The length of the wetting coverage of fused solder powders was measured as in Example 1 with the exception that 3-iodopropionic acid was used instead of potassium iodide. The results are shown in Table 13.

EXAMPLE 5

The length of the wetting coverage of fused solder powders was measured as in Example 1 with the exception that the amount of potassium iodide was changed to 2.0 grams with the addition of 1.0 gram of alanine. The results are shown in Table 13.

EXAMPLE 6

The length of the wetting coverage of fused solder powders was measured as in Example 5 with the exception that anthranilic acid was used for alanine. The results are shown in Table 13.

EXAMPLE 7

The length of the wetting coverage of fused solder powders was measured as in Example 1 with the exception that no copper sulfate was used. The results are shown in Table 13.

Reference Example 1

The length of the wetting coverage of fused solder powders was measured as in Example 1 with the exception that 6-methyl-2-n-propylbenzimidazole was not used. The results are shown in Table 13.

Reference Example 2

The length of the wetting coverage of fused solder powders was measured as in Example 1 with the exception that 2-phenyl-methylbenzimidazole was not used. The results are shown in Table 13.

Reference Example 3

The length of the wetting coverage of fused solder powders was measured as in Example 1 with the exception that no potassium iodide was used. The results are shown in Table 13.

Reference Example 4

The length of the wetting coverage of fused solder powders was measured as in Example 1 with the exception that potassium chloride was used for potassium iodide. The results are shown in Table 13.

As a result of SEM (scanning electron microscope) evaluation of the surfaces of the test pieces of Examples 5 and 6 covered with the water-soluble preflux, no change was found at all, indicating that both the test pieces had sufficient soldering strength upon soldering of the chip parts with no occurrence of any soldering bridge.

TABLE 13

Length of the wetting coverage of fused solder of solder powders in the solder paste films

| Testing Conditions | Inventive Example | | | | | | | Ref. Ex. | | | |
|---|---|---|---|---|---|---|---|---|---|---|---|
| | 1 | 2 | 3 | 4 | 5 | 6 | 7 | 1 | 2 | 3 | 4 |
| (A) | 6.0 | 6.0 | 6.0 | 5.8 | 6.5 | 6.5 | 6.0 | 4.0 | 4.5 | 2.8 | 3.2 |
| (B) | 3.5 | 3.8 | 3.8 | 3.5 | 4.0 | 4.0 | 3.5 | 2.8 | 3.3 | 1.8 | 2.0 |
| (C) | 3.2 | 3.5 | 3.2 | 3.2 | 3.8 | 3.5 | 3.2 | 2.2 | 3.0 | 1.5 | 1.5 |
| (D) | 2.8 | 3.0 | 2.8 | 3.0 | 3.5 | 3.2 | 2.8 | 1.5 | 2.2 | 1.2 | 1.2 |

Length measured in mm
(A) Measured before the degradation by heating
(B) Measured after the 1st degradation by heating
(C) Measured after the 2nd degradation by heating
(D) Measured after the 3rd degradation by heating From the results of Table 13, i.e., from comparisons of Inventive Examples 1–4 and 7 with Inventive Examples 5 and 6, it is found that before the degradation by heating, 6.5 mm in the latter examples is an about 8% better than the best 6.0 mm in the former examples and even after the 3rd degradation by heating, the lowest in the latter is an about 7% better than the highest in the former; the more the iodine-based compound used, the higher the effects and such effects are much more enhanced by the combined use of that compound and the amino acid.

From comparisons of Inventive Examples 1 and 7 with Reference Examples 1 and 2, it is found that before the degradation by heating, the figures in Inventive Examples 1 and 7 are an about 27% better than the higher figure in Reference Examples 1 and 2 and after the 3rd degradation by heating, the former are an about 27% better than the latter; the synergistic effect by the combined use of two separate benzimidazoles is much more higher than the effect resulting from their sole use.

From comparisons of Inventive Examples 1 and 7 with Reference Examples 3 and 4, it is found that before the degradation by heating, the figures in Inventive Examples 1 and 7 are an about 88% better than the higher figure in Reference Examples 3 and 4 and after the 3rd degradation by heating, the former is at least two-fold better than the latter; as the degradation of the copper foil by heating proceeds, the effect of using the iodine-based compound becomes more prominent. It is noted that Reference Examples 1 and 2 are all better than Reference Examples 3 and 4; however, they are not known so far in the art and so are provided for reference.

As the wetting coverage of fused solder over soldering lands is satisfactory, the fused solder is well wetted to and spread over the whole surface of the soldering lands so that the adhesion power of the soldering lands to a metallic surface can increase. Moreover, the fused solder is kept from concentrating on the middle of a certain soldering land due to its surface tension into a droplet, and so from going over the adjacent soldering lands and coming into contact with fused solder similarly formed thereon. This could be one possible explanation of why any soldering bridge is avoided, although not necessarily bound thereto.

Thus, as the wetting coverage of fused solder over the soldering lands is satisfactory, the area of the fused solder spread over the soldering lands is enlarged and, accordingly, the adhesion power of solder to the soldering lands is so increased that the soldering strength for electronic parts can be enhanced. Thus, even when the amount of the solder paste to be coated is reduced, the desired soldering strength is obtainable.

The more preferable compounds among the acidic group-containing compounds and iodine compounds represented by the aforesaid general formulae (1), (4) to (7) as well as the aforesaid general formulae (2), (8) to (10) and (11) to (16) and compounds similar to or analogous with the compounds used in Inventive Examples 1 to 7, too, may be used according to these examples.

According to the present invention where given two types of benzimidazoles are used in combination with the iodine-based compound, the fused solder can be better wetted to and spread over soldering lands in general, and a soldering land array having a narrow spacing, as compared with the use of each benzimidazole compound in combination with the diode-based compound, to say nothing of the use of each in combination with a compound other than the iodine-based compound, e.g., a chloride. Moreover, the fused solder can be well wetted to and spread over soldering lands that have degraded upon heated to high temperature for the purpose of both-sided mounting, so that the incidence of soldering bridges can be reduced, making soldering strength sufficient and decreasing the incidence of poor soldering, resulting in productivity improvements. Thus, the present invention provides a water-soluble preflux that permits a heat-resistant film showing very excellent humidity resistance even after exposed to high humidity to be formed on the surface of copper or a copper alloy for circuit patterns on printed circuit board and to be much improved in terms of the protection and solderability of printed circuit boards upon part mounting, a printed circuit board and a surface treatment process for metals on printed circuit boards.

The present invention also provides a water-soluble preflux that can be used in combination with an acidic group-containing amine-based compound or other amine-based compound to make a benzimidazole-based compound soluble without recourse to conventionally used acids, so that the amount of the iodine-based compound used can be increased thereby achieving the aforesaid advantages more satisfactorily, and solve problems with the oxidation of solder, soldering strength drops due to erosion of lead, etc. which are caused when acids are used as solubilizes as usual, a printed circuit board and a surface treatment process for metals on printed circuit boards.

Furthermore, the present invention provides a water-soluble preflux that can be fabricated and used as is the case with conventional water-soluble prefluxes using benzimidazole-based compounds, permits each component to keep its stability intact irrespective of temperature changes and prevents working environments from becoming worse due to volatile acids, a printed circuit board and a printed circuit board fabrication process.

What is claimed is:

1. A water-soluble preflux comprising at least one compound selected from the group consisting of compounds represented by the following general formulae (1) and (3), at least one compound having the following general formula (2), and an iodine-based compound:

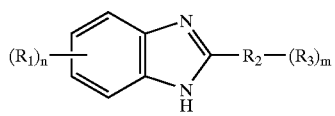

Formula (1)

where $R_1$ is a straight-chain or branched-chain alkyl group having 1 to 7 carbon atoms, a halogen atom, an amino group, a di-lower alkylamino group, a hydroxy group, a lower alkoxy group, a cyano group, an acetyl group, a benzoyl group, a carbamoyl group, a formyl group, a carboxyl group, a lower alkoxycarbonyl group or a nitro group with the proviso that when $R_1$ represents two or more groups, they may be different from or identical with each other, $R_2$ is a straight-chain or branched-chain alkyl group, $R_3$ is a phenyl group or an alkylphenyl group with the proviso that when $R_3$ represents two or more groups, they may be different from or identical with each other, n is an integer of 0 to 4, and m is an integer of 0 to 3;

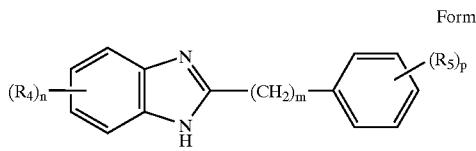

Formula (2)

where each of $R_4$ and $R_5$ is a straight-chain or branched-chain alkyl group having 1 to 7 carbon atoms, a halogen atom, an amino group, a di-lower alkylamino group, a hydroxy group, a lower alkoxy group, a cyano group, an acetyl group, a benzoyl group, a carbamoyl group, a formyl group, a carboxyl group, a lower alkoxycarbonyl group or a nitro group with the proviso that when each of $R_4$ and $R_5$ represents two or more groups, they may be different from or identical with each other, $R_5$ may be a straight-chain or branched-chain alkyl group, a phenyl group, an alkylphenyl group or an phenylalkyl group with the proviso that when $R_5$ represents two or more groups, they may be different from or identical with each other, n is an integer of 0 to 4, m is an integer of 0 to 10, and p is an integer of 0 to 4; and

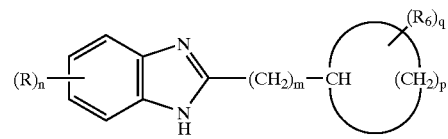

Formula (3)

where R is a straight-chain or branched-chain alkyl group having 1 to 7 carbon atoms with the proviso that when R represents two or more groups, they may be different from or identical with each other, $R_6$ is a straight-chain or branched-chain alkyl group having 1 to 7 carbon atoms with the proviso that when $R_6$ represents two or more groups, they may be different from or identical with each other, n is an integer of 0 to 3, m is an integer of 0 to 4, p is an integer of 0 to 3, and q is an integer of 0 to 4.

2. The water-soluble preflux according to claim 1, comprising at least one compound selected from the group consisting of compounds represented by the aforesaid formulae (1) and (3), at least one compound represented by the aforesaid general formula (2), an iodine-based compound, and an amine-based compound.

3. The water-soluble preflux according to claim 2, wherein the ratio of at least one compound selected from the group consisting of compounds represented by the aforesaid general formulae (1) and (3) used with respect to at least one compound represented by the aforesaid general formula (2) is in the range of 0.5 to 5 on a mass basis.

4. The water-soluble preflux according to claim 3, wherein the amine-based compound is a solubilizer comprising at least one of heterocyclic rings having a ring containing a primary amino group, a secondary amino group, a tertiary amino group and a nitrogen atom capable of forming an insoluble salt with at least one compound selected from the group consisting of compounds represented by the aforesaid general formulae (1) and (3) and at least one compound represented by the aforesaid general formula (2) and having an acidic group.

5. The water-soluble preflux according to claim 4, wherein the solubilizer comprises at least one compound selected from the group consisting of compounds represented by the following general formulae (11) to (16), L-theanine, pyroglutamic acid, pyrrolidine-2,4-dicarboxylic acid, folic acid, DL-threonine, L-threonine, L-tryptophan, L-phenylalanine and quinaldinic acid and their derivatives:

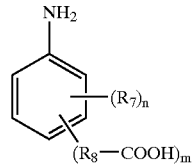

Formula (11)

where $R_7$ is a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_7$ represents two or more groups, they may be different from or identical with each other, $R_8$ may be zero, and is a straight-chain or branched-chain alkylene group having 1 to 20 carbon atoms with the proviso that when $R_8$ represents two or more groups, they may be different from or identical with each other, n is an integer of 0 to 4, and m is an integer of 1 to 5;

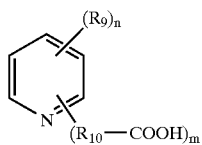

Formula (12)

where $R_9$ is a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_9$ represents two or more groups, they may be different from or identical with each other, $R_{10}$ may be zero, and is a straight-chain or branched-chain alkylene group having 1 to 20 carbon atoms with the proviso that when $R_{10}$ represents two or more groups, they may be different from or identical with each other, n is an integer of 0 to 4, and m is an integer of 1 to 5;

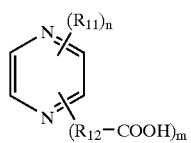

Formula (13)

where $R_{11}$ is a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_{11}$ represents two or more groups, they may be different from or identical with each other, $R_{12}$ may be zero, and is a straight-chain or branched-chain alkylene group having 1 to 20 carbon atoms with the proviso that when $R_{12}$ represents two or more groups, they may be different from or identical with each other, n is an integer of 0 to 3, and m is an integer of 1 to 4;

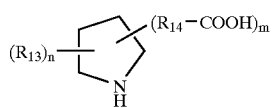

Formula (14)

where $R_{13}$ is a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_{13}$ represents two or more groups, they may be different from or identical with each other, $R_{14}$ may be zero, and is a straight-chain or branched-chain alkylene group having 1 to 20 carbon atoms with the proviso that when $R_{14}$ represents two or more groups, they may be different from or identical with each other, n is an integer of 0 to 3, and m is an integer of 1 to 4;

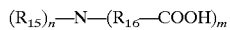

Formula (15)

where $R_{15}$ is a hydrogen atom, a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_{15}$ represents two or more groups, they may be different from or identical with each other, $R_{16}$ may be zero, and is a straight-chain or branched-chain alkylene group having 1 to 20 carbon atoms with the proviso that when $R_{16}$ represents two or more groups, they may be different from or identical with each other, n is an integer of 0 to 2, and m is an integer of 1 to 3; and

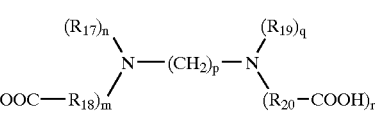

Formula (16)

where $R_{17}$ is a hydrogen atom, a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_{17}$ represents two, they may be different from or identical with each other, $R_{19}$ is a hydrogen atom, a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_{19}$ represents two, they may be different from or identical with each other, $R_{18}$ may be zero, and is a straight-chain or branched-chain alkylene group having 1 to 20 carbon atoms with the proviso that when $R_{18}$ represents two groups, they may be different from or identical with each other, $R_{20}$ may be zero, and is a straight-chain or branched-chain alkylene group having 1 to 20 carbon atoms with the proviso that when $R_{20}$ represents two groups, they may be different from or identical with each other, n is an integer of 0 to 2, m is an integer of 0 to 2, p is an integer of 0 to 4, q is an integer of 0 to 1, and r is an integer of 1 to 2.

6. The water-soluble preflux according to claim 2, wherein the amine-based compound is a solubilizer comprising at least one of heterocyclic rings having a ring containing a primary amino group, a secondary amino group, a tertiary amino group and a nitrogen atom capable of forming an insoluble salt with at least one compound selected from the group consisting of compounds represented by the aforesaid general formulae (1) and (3) and at least one compound represented by the aforesaid general formula (2) and having an acidic group.

7. The water-soluble preflux according to claim 6, wherein the solubilizer comprises at least one compound selected from the group consisting of compounds represented by the following general formulae (11) to (16), L-theanine, pyroglutamic acid, pyrrolidine-2,4-dicarboxylic acid, folic acid, DL-threonine, L-threonine, L-tryptophan, L-phenylalanine and quinaldinic acid and their derivatives:

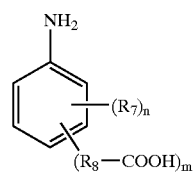

Formula (11)

where $R_7$ is a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_7$ represents two or more groups, they may be different from or identical with each other, $R_8$ may be zero, and is a straight-chain or branched-chain alkylene group having 1 to 20 carbon atoms with the proviso that when $R_8$ represents two or more groups, they may be different from or identical with each other, n is an integer of 0 to 4, and m is an integer of 1 to 5;

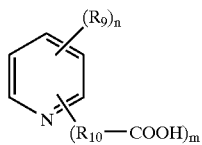

Formula (12)

where $R_9$ is a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_9$ represents two or more groups, they may be different from or identical with each other, $R_{10}$ may be zero, and is a straight-chain or branched-chain alkylene group having 1 to 20 carbon atoms with the proviso that when $R_{10}$ represents two or more groups, they may be different from or identical with each other, n is an integer of 0 to 4, and m is an integer of 1 to 5;

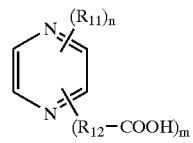

Formula (13)

where $R_{11}$ is a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_{11}$ represents two or more groups, they may be different from or identical with each other, $R_{12}$ may be zero, and is a straight-chain or branched-chain alkylene group having 1 to 20 carbon atoms with the proviso that when $R_{12}$ represents two or more groups, they may be different from or identical with each other, n is an integer of 0 to 3, and m is an integer of 1 to 4;

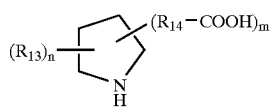

Formula (14)

where $R_{13}$ is a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_{13}$ represents two or more groups, they may be different from or identical with each other, $R_{14}$ may be zero, and is a straight-chain or branched-chain alkylene group having 1 to 20 carbon atoms with the proviso that when $R_{14}$ represents two or more groups, they may be different from or identical with each other, n is an integer of 0 to 3, and m is an integer of 1 to 4;

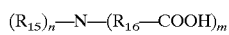

Formula (15)

where $R_{15}$ is a hydrogen atom, a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_{15}$ represents two or more groups, they may be different from or identical with each other, $R_{16}$ may be zero, and is a straight-chain or branched-chain alkylene group having 1 to 20 carbon atoms with the proviso that when $R_{16}$ represents two or more groups, they may be different from or identical with each other, n is an integer of 0 to 2, and m is an integer of 1 to 3; and

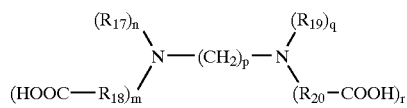

Formula (16)

where $R_{17}$ is a hydrogen atom, a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_{17}$ represents two, they may be different from or identical with each other, $R_{19}$ is a hydrogen atom, a straight-chain or branched-chain alkyl group having 1 to 20 carbon atoms, a halogen atom, a hydroxyl group, a lower alkoxyl group, a cyano group, an acetyl group, a benzoyl group, a carbamoyl group, a formyl group or a nitro group with the proviso that when $R_{19}$ represents two, they may be different from or identical with each other, $R_{18}$ may be zero, and is a straight-chain or branched-chain alkylene group having 1 to 20 carbon atoms with the proviso that when $R_{18}$ represents two groups, they may be different from or identical with each other, $R_{20}$ may be zero, and is a straight-chain or branched-chain alkylene group having 1 to 20 carbon atoms with the proviso that when $R_{20}$ represents two groups, they may be different from or identical with each other, n is an integer of 0 to 2, m is an integer of 0 to 2, p is an integer of 0 to 4, q is an integer of 0 to 1, and r is an integer of 1 to 2.

8. The water-soluble preflux according to claim 2, wherein the iodine-base compound is at least one selected from the group consisting of hydriodic acid, a metal salt of hydriodic acid and an iodized organic acid.

9. A printed circuit board having a metal layer for a circuit pattern on its surface, wherein said metal layer comprises a film of a water-soluble preflux as recited in claim 2.

10. A surface treatment process for a metal in a printed circuit board, wherein a metal layer for a circuit pattern on a printed circuit board is subjected to rust-preventive treatment by a step of coating thereon a water-soluble preflux as recited in claim 2.

11. The water-soluble preflux according to claim 1, wherein the ratio of at least one compound selected from the group consisting of compounds represented by the aforesaid general formulae (1) and (3) used with respect to at least one compound represented by the aforesaid general formula (2) is in the range of 0.5 to 5 on a mass basis.

12. The water-soluble preflux according to claim 1, wherein the iodine-base compound is at least one selected from the group consisting of hydriodic acid, a metal salt of hydriodic acid and an iodized organic acid.

13. A printed circuit board having a metal layer for a circuit pattern on its surface, wherein said metal layer comprises a film of a water-soluble preflux as recited in claim 1.

14. A surface treatment process for a metal in a printed circuit board, wherein a metal layer for a circuit pattern on a printed circuit board is subjected to rust-preventive treatment by a step of coating thereon a water-soluble preflux as recited in claim 1.

* * * * *